United States Patent [19]

Nguyen

[11] Patent Number: 5,089,728

[45] Date of Patent: Feb. 18, 1992

[54] SPIKE CURRENT REDUCTION IN CMOS SWITCH DRIVERS

[75] Inventor: Thai M. Nguyen, Santa Clara, Calif.

[73] Assignee: National Semiconductor Corporation, Santa Clara, Calif.

[21] Appl. No.: 404,244

[22] Filed: Sep. 6, 1989

[51] Int. Cl.⁵ .................. H03K 19/12; H03K 19/092
[52] U.S. Cl. ........................... 307/572; 307/263; 307/270; 307/294.4; 307/481; 307/542; 307/546; 307/558
[58] Field of Search .................. 307/263, 296.4, 270, 307/480–481, 542, 546, 555–558, 572

[56] References Cited

U.S. PATENT DOCUMENTS 4,857,763  8/1989  Sakurai et al. ................ 307/443

FOREIGN PATENT DOCUMENTS 57161  5/1975  Japan .
0215220  9/1988  Japan ................... 307/481

Primary Examiner—Stanley D. Miller
Assistant Examiner—Margaret Rose Wambach
Attorney, Agent, or Firm—Gail W. Woodward; Irving S. Rappaport; Michael A. Glenn

[57] ABSTRACT

A CMOS switch driver capable of driving a plurality of CMOS switches is disclosed. A pair of cascade coupled output inverters provide the complementary driver outputs. Their inputs are obtained respectively from the first of the pair and a third, or input, inverter. The circuit includes resistance elements in the output inverters that greatly reduce current spikes.

6 Claims, 1 Drawing Sheet

SPIKE CURRENT REDUCTION IN CMOS SWITCH DRIVERS

BACKGROUND OF THE INVENTION

The invention relates to CMOS switch drivers in which switching or clock signals are provided to a plurality of N channel and P channel transistors in a complementary metal oxide semiconductor (CMOS) system. In a CMOS circuit the P channel transistors typically have their source electrodes returned to a common positive power supply rail and the N channel transistors typically have their sources returned to the common negative power supply rail. Thus, when the P channel transistor gates are at the positive rail potential they are off and when the gates are at the negative rail potential they are turned full on. Conversely, when the N channel transistor gates are at the negative rail potential they are off and when their gates are at the positive rail potential they are turned full on. In order to ensure complete switching the P and N channel transistor gates should be driven by rail-to-rail switching signals. Thus, where a CMOS gate is formed by a P channel and an N channel transistor connected in series between the power supply rails, the switching signal must pass through the linear device operating region. For this condition a current flow will occur while the linear region is being traversed. This is called the spike current which results in power dissipation during the transition. If the switching is rapid the spike is narrow and the dissipated power is low. However, where a switch driver is required to drive a number of switch transistors its output transistors must be made relatively large. This results in a large spike current which can be troublesome. First, the spike current acts to heat the integrated circuit chip and this is undesirable, particularly where a high operating frequency is required. Second, the spike current must be produced by the power supply and, due to power supply regulation, supply rail noise is produced. This can be troublesome with respect to other circuits that are operated by the power supply. In order to control such noise the power supply requirements become difficult to achieve.

Japanese patent publication 57161 was published in 1975 and represents prior art to the present invention. A copy of this publication, along with an abridged translation, accompanies this application. A CMOS noninverting gate circuit is disclosed. The gate is shown as having a transfer function that displays substantial hysteresis and a low spike current. While this prior art publication is relevant, it does not disclose the circuit of the invention.

DESCRIPTION OF THE PRIOR ART

FIG. 1 is a schematic diagram of a typical prior art CMOS switch driver which is employed to drive a plurality of P and N channel transistors. An operating power supply is connected + to $V_{DD}$ terminal 10 and − to $V_{SS}$ terminal 11. An input signal is connected to terminal 12 and its complement to terminal 13. Thus, input terminals 12–13 are driven in paraphase by a clock signal obtained from a common oscillator. An in-phase output appears at terminal 14 and this signal is intended to drive the gates of the plurality of N channel switch transistors. The complement will appear at terminal 15 and is intended to drive the gates of the plurality of P channel switch transistors. This choice of transistor drive is arbitrary and the choice could be made on a complementary basis.

It can be seen that transistors 20 and 21 form an inverter gate that drives transistors 22 and 23 which form a second inverter gate. The second inverter gate in turn drives transistors 24 and 25 which form a third inverter gate. Outputs 14 and 15 provide complementary drives and are taken respectively from the second and third inverter gates. Transistors 22–25 are typically required to drive a relatively large number of CMOS switch transistors and are therefore typically quite large. This invokes a large spike current that places a severe requirement on the operating power supply and results in substantial IC chip heating. It is to be noted that transistors 20 and 21 are only required to drive the gates of transistors 22 and 23. Thus, transistors 20 and 21 are relatively small and do not contribute significantly to the spike current.

The circuit of FIG. 1 displays mirror symmetry in that transistors 20–25 are duplicated on the left-hand half of the circuit and they are operated complementarily. Thus, the output at terminal 16 is in phase with the signal at terminal 12 and the output at terminal 17 is complementary thereto. However, since both halves of the circuit switch, when the devices are driven through their linear regions, their spike current contributions are additive and therefore particularly troublesome.

SUMMARY OF THE INVENTION

It is an object of the invention to provide a CMOS switch driver that has reduced current spikes.

It is a further object of the invention to reduce the spike current in a switch driver having a large output capability for driving a plurality of CMOS switches.

It is a still further object of the invention to reduce the current spikes in a CMOS switch driver without reducing its driving capability.

These and other objects are achieved as follows. A switch driver is constructed in the usual manner of cascading three CMOS inverter gates. The latter two of these gates employ large area devices that are capable of driving a plurality of switches. The last inverter gate has an output dedicated to driving the CMOS P channel switches and the penultimate inverter gate is dedicated to driving the CMOS N channel switches. The last inverter gate includes a resistance element in series with the transistor drains and has its output taken from the P channel transistor drain. The penultimate inverter gate also has a resistance element coupled in series between the transistor drains and its output is taken from the N channel transistor drain. The drain of the penultimate inverter gate P channel transistor is directly connected to the gate of the last inverter gate P channel transistor. The gate of the last inverter gate N channel transistor is directly connected to the drain of the N channel transistor in the penultimate inverter gate. This circuit configuration displays a greatly reduced spike current without any compromise of the number of switches that can be driven.

DESCRIPTION OF THE INVENTION

Figure 1:
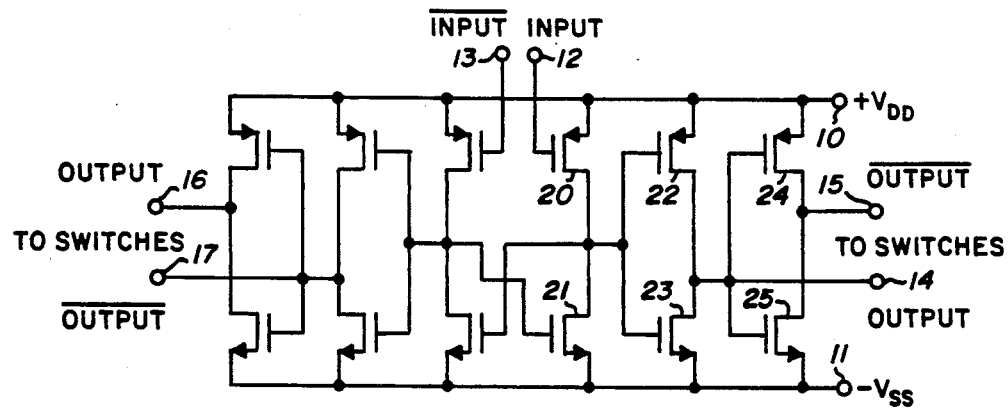
FIG. 1 is a schematic diagram of a prior art CMOS switch driver.
Figure 2:
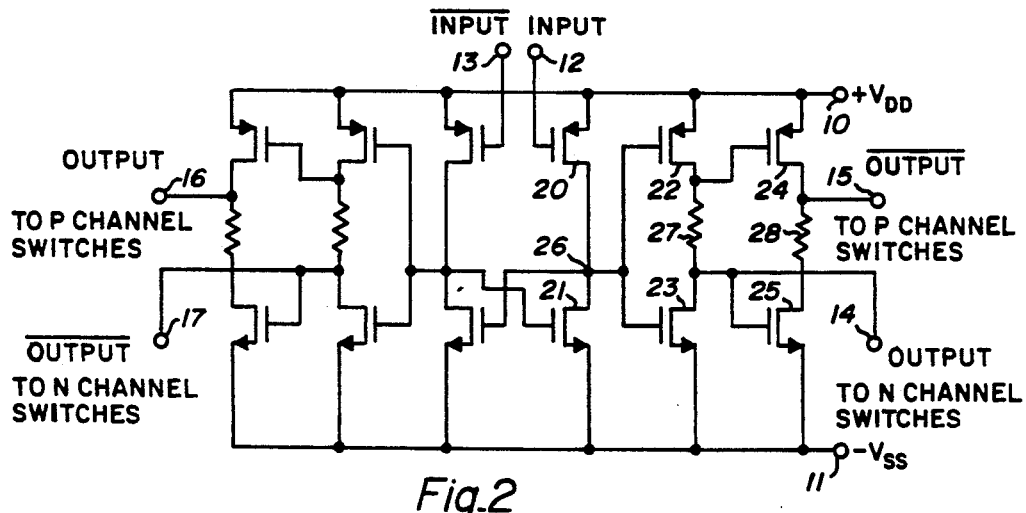
FIG. 2 is a schematic diagram of the CMOS switch driver of the invention.

Where the elements of FIG. 2 function in the same way as those of FIG. 1, the same reference numerals are used. By inspection it is clear that a pair of resistors 27 and 28 have been added to the output inverter gates. Resistor 27 is coupled between the drains of transistors 22 and 23 which form the penultimate output inverter gate. Resistor 28 is coupled between the drains of transistors 24 and 25 which form the last inverter gate.

Transistors 20 and 21 form the first or input inverter gate and node 26 comprises its output. Node 26 will be driven substantially rail-to-rail in response to an oscillator signal at terminal 12. It will be noted transistor 21 is driven in phase with the signal at terminal 12 from the mirror symmetry opposite half of the circuit. Node 26 directly drives the gates of transistors 22 and 23. The drain of transistor 22 is directly connected to the gate of transistor 24, the drain of which provides output terminal 15. The drain of transistor 23 provides output terminal 14 and is also directly connected to the gate of transistor 25.

It is to be understood that transistors 22-25 are all large area devices capable of substantial output drive. Thus, all four have a substantial gate capacitance. When node 26 is driven high, transistor 23 will be turned on fast and transistor 22 will be turned off fast. As the potential at node 26 passes through the devices linear region, a current spike will occur in transistors 22 and 23, but its magnitude will be limited by resistor 27. By making resistor 27 large, with respect to the on resistance of the FET's, the spike can be kept reasonably small. Since the rapid rise of node 26 will rapidly turn transistor 23 on to its maximum conduction state, terminal 14 will go low quickly. Conduction in transistor 23, which has a large area, can quickly discharge the capacitance represented by a plurality of N channel switches connected to terminal 14 and therefore turn them off rapidly. This action will also turn transistor 25 on rapidly.

The rise at node 26 will rapidly turn transistor 22 off and conduction in transistor 23 will sink current through resistor 27 which will charge the gate of transistor 24 so as to turn it on. However, the RC time constant of resistor 27 and the capacitance of the gate of transistor 24 will result in a delayed, or soft, turn on. Therefore, transistor 24 will turn on well after transistor 25. This delay action will eliminate the current spike that would ordinarily occur in transistors 24 and 25. Thus, the signal at terminal 15, which will turn off the driven P channel switches, is delayed and soft.

When node 26 is driven low transistor 22 will be rapidly turned on and transistor 23 will rapidly be turned off. The rapid turn on of transistor 22 will rapidly turn transistor 24 off. Terminal 14, which drives the plurality of N channel switches, will slowly be pulled up through resistor 27. This provides a slow turn on of the N channel switches as well as transistor 25. Again, it can be seen that since transistor 24 turns on quickly and transistor 25 turns on slowly, the current spike in transistors 24 and 25 is avoided.

In summary, the circuit of FIG. 2 will drive the output terminal 14 up slowly and down rapidly, which will switch the N channel transistors connected thereto off rapidly and on slowly. Terminal 15 will be operated to slowly turn the P channel transistors connected thereto off and on. This action avoids any spike current in the third inverter gate and minimizes the spike current in the penultimate gate. Since the first inverter gate employs small transistors its spike current can be neglected. This circuit configuration also ensures staggered conduction in the driven N and P channel switch transistors so that they too avoid spike currents.

Figure 3:
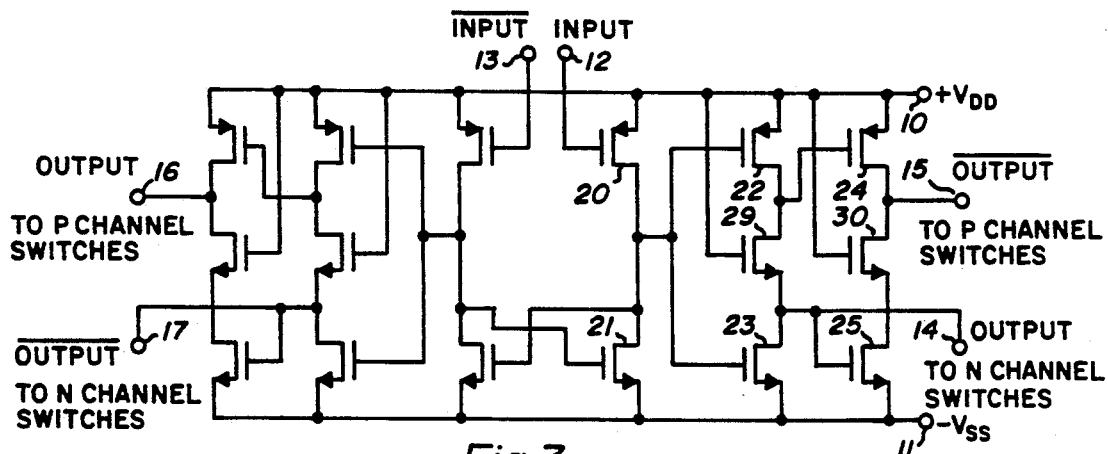
FIG. 3 is a schematic diagram of an alternative embodiment of the invention.

FIG. 3 shows an alternative embodiment of the invention. Here N channel transistors 29 and 30 respectively replace resistors 27 and 28 of FIG. 2. The gates of transistors 29 and 30 are returned to the positive supply rail so that they are fully turned on. In this state the N channel transistors act like resistors which have a relatively high value determined by their geometry. In the embodiment of FIG. 3 transistors 29 and 30 each could have a W/L of 6/30 microns. This would produce a resistance value of about 5 k ohms. It is to be understood that while transistors 29 and 30 are illustrated as N channel devices, P channel transistors, with their gates returned to the negative supply rail, could be used. Otherwise, the functioning of the circuit of FIG. 3 is the same as that of FIG. 2.

EXAMPLE

The circuit of FIG. 2 was constructed using the following transistor sizes:

| TRANSISTOR | CHANNEL TYPE | W/L DIMENSIONS (MICRONS) |
|---|---|---|
| 20 | P | 60/5 |
| 21 | N | 5/25 |
| 22 | P | 400/5 |
| 23 | N | 200/5 |
| 24 | P | 400/5 |
| 25 | N | 200/5 |

Resistors 27 and 28 were each 5000 ohms. A 25 kHz clock signal was applied to terminal 12 and its complement to terminal 13. The outputs at terminals 14 and 15 could respectively drive 4 switches of conventional CMOS design. This represents a capacitive load of about 30 picofarads at each output terminal. The circuit functioned adequately to drive the switches and displayed a spike current of less than 15% of that of the prior art circuit as represented in FIG. 1.

The invention has been described and a working example detailed. When a person skilled in the art reads the foregoing description, alternatives and equivalents, within the spirit and intent of the invention, will be apparent. Accordingly, it is intended that the scope of the invention be limited only by the claims that follow.

I claim:

1. A CMOS switch driver circuit having output terminals that are capable of driving a plurality of separate N channel and P channel CMOS switches and having positive and negative rails connectable to a single power supply, said driver comprising:

first and second inverter gates, each comprising an N channel transistor and a P channel transistor, each of said N channel and P channel transistors having source, drain and gate electrodes, said first and second inverter gates being coupled in cascade, driven by a source of clock signals and subject to spike currents during clock signal transitions;

said first inverter gate including a first resistive element connected in series with the drain electrodes of the transistors comprising said first inverter gate and a first output terminal taken from the drain of the N channel transistor; and said second inverter gate including a second resistance element connected in series with the drain electrodes of the transistors comprising said second inverter gate and a second output terminals taken from the drain of the P channel transistor.

2. The CMOS switch driver circuit of claim 1 wherein said first and second output terminals respectively drive said separate N channel and P channel CMOS switches complementarily.

3. The CMOS switch driver circuit of claim 1 wherein said resistance elements comprise MOS transistors having their gates connected to that power supply rail which will produce conduction therein.

4. The CMOS switch driver of claim 1 wherein said resistance elements have values that are large with respect to the on resistance of said transistors in said inverter gates.

5. The CMOS switch driver circuit of claim 2 wherein said first resistance element functions to minimize the current spikes in said first inverter gate.

6. The CMOS switch driver circuit of claim 2, wherein said driver circuit comprises transistors having substantial capacitance and said resistance elements form time constants therewith whereby the conduction of the transistors comprising said inverter gates are delayed thereby minimizing current spikes within said inverter gates.

* * * * *